United States Patent [19]
Bellanger et al.

[11] 3,971,922
[45] July 27, 1976

[54] CIRCUIT ARRANGEMENT FOR DIGITALLY PROCESSING A GIVEN NUMBER OF CHANNEL SIGNALS

[75] Inventors: Maurice Georges Bellanger, Antony; Jacques Lucien Daguet, St.-Maur-des-Fosses, both of France

[73] Assignee: Telecommunications Radioelectriques et Telephoniques T.R.T., Paris, France

[22] Filed: Nov. 29, 1974

[21] Appl. No.: 528,506

[52] U.S. Cl. ............................ 235/152; 179/15 FS; 325/42
[51] Int. Cl.[2] ........................................... G06F 7/38
[58] Field of Search ........................... 235/152, 156; 179/15 FS, 15 FD; 325/42; 328/167

[56] References Cited
UNITED STATES PATENTS

| | | | |
|---|---|---|---|
| 3,349,182 | 10/1967 | Ito et al. ............................... | 179/15 |
| 3,619,586 | 11/1971 | Hoff, Jr. et al. ...................... | 235/156 |
| 3,665,171 | 5/1972 | Morrow ............................... | 235/152 |
| 3,676,598 | 7/1972 | Kurth................................. | 179/15 FD |
| 3,872,381 | 3/1975 | Yamamoto et al. .................. | 325/42 |

Primary Examiner—Joseph F. Ruggiero
Attorney, Agent, or Firm—Frank R. Trifari; Simon L. Cohen

[57] ABSTRACT

An arrangement for digitally processing a given number of analog channel signals, more particularly a digital multiplexer and demultiplexer provided with a number of signal paths each comprising a recursive digital filter and delay circuits arranged in cascade therewith, said filter circuits having an amplitude-frequency characteristic of a lowpass filter having a cut-off frequency which is equal to half the bandwidth of a channel signal and a phase-frequency characteristic which is such that the difference between such a phase-frequency characteristic and the phase-frequency characteristic of a reference digital filter has a sawtooth-shaped variation, the slope of the sawtooth being opposite to the slope of the cooperating delay circuit. The arrangement furthermore comprises in cascade a discrete Fourier transformer connected to the signal paths.

10 Claims, 10 Drawing Figures

CIRCUIT ARRANGEMENT FOR DIGITALLY PROCESSING A GIVEN NUMBER OF CHANNEL SIGNALS

The invention relates to an arrangement for digitally procesing a given number of channel signals each having a given bandwidth, which arrangement is suitable for converting a single sideband frequency division multiplex signal into the corresponding base band channel signals and for converting a given number of base band channel signals into a single sideband frequency division multiplex signal.

For converting a single sideband frequency division multiplex signal into the corresponding base band channel signals, the arrangement includes a series parallel converter distributing binary coded signal samples (code words) of the multiplex signal equally in time in a cyclical manner over a given number of parallel signal paths while the signal samples in each of these signal paths occur at a frequency which is equal to the bandwidth of a channel signal. In this arrangement each of the signal paths incorporates a delay circuit for eliminating the mutual time shifts of the signal samples applied within a cycle to said series parallel converter, a calculating member being provided in series with said delay circuit to which in addition to the output samples of the co-operating delay circuits a given number of filter coefficients is applied which are provided by a source for a given number of filter coefficients, the outputs of said calculating members being coupled to inputs of a discrete Fourier transformer whose outputs are connected to demodulators.

For converting a given number of base band channel signals into a single sideband frequency division multiplex signal the arrangement includes an inverse discrete Fourier transformer to which binary coded signal samples of each of the base band channel signals are applied and which is provided with an output circuit having a given number of signal paths in which binary coded signal samples occur at a frequency which is equal to the bandwidth of a channel signal. These signal paths are each provided with a series arrangement of a calculating member and a delay circuit to which calculating member not only the signal samples occurring in the relevant signal path are applied but also a given number of filter coefficients which are derived from a source for a given number of filter coefficients, while the outputs of these delay circuits are connected to a common output line, the delay times of said delay circuit being adjusted in such a manner that the binary coded signal samples occurring in the signal path occur simultaneously and distributed in time on the said common output line.

An optimum reduction of the calculation speed in the calculation circuits is obtained with such an embodiment of a multiplex and a demultiplex arrangement. In fact these circuits receive signal samples at a frequency which is equal to the bandwidth of a channel signal and this reduction of the calculation speed has the result that such an arrangement can be manufactured by means of large scale integration (LSI).

These arrangements described in the preamble are proposed in U.S. Pat. No. 3,891,803. The calculating members used are circuits of the non-recursive type each having a frequency which is equal to the bandwidth of a channel signal and providing the weighted sum of a given number of incoming binary coded signal samples and coefficients. These coefficients characterize a lowpass filter having a cut-off frequency which is equal to half the bandwidth of a channel signal. To obtain certain characteristics of the system such as a small crosstalk between the channels, and low distortion, the calculating members formed in this manner are fairly complex. For example, per calculating member a large number of coefficients is necessary so as to realize the filter characteristic and consequently the number of multipliers and stores is very large.

It is an object of the invention to provide arrangements of the kind described in the preamble in which the complexity of the calculating member is considerably reduced.

According to the invention each calculating member is formed as a recursive digital filter to which binary coded signal samples are applied having an input sampling frequency which is equal to the bandwidth of a channel signal and to which also filter coefficients originating from said source are applied, which filter coefficients characterize an amplitude-frequency characteristic of a low-pass filter having a cut-off frequency which corresponds to the half bandwidth of a channel signal and which characterize a phase-frequency characteristic, the phase-frequency characteristic indicating the difference between the phase-frequency characteristic of a calculating member and the phase-frequency characteristic of a calculating member connected to the output of a reference delay circuit, a sawtooth-shaped characteristic which is constituted by straight lines varying with a given angle of inclination in a parallel manner and intersecting the frequency axis in case of integral multiples of the said input sampling frequency while the slope of said sawtooth characteristic is opposite to the slope of the phase-frequency characteristic of the co-operating delay circuit.

The invention and its advantages will now be described with reference to the accompanying Figures.

Figure 1:
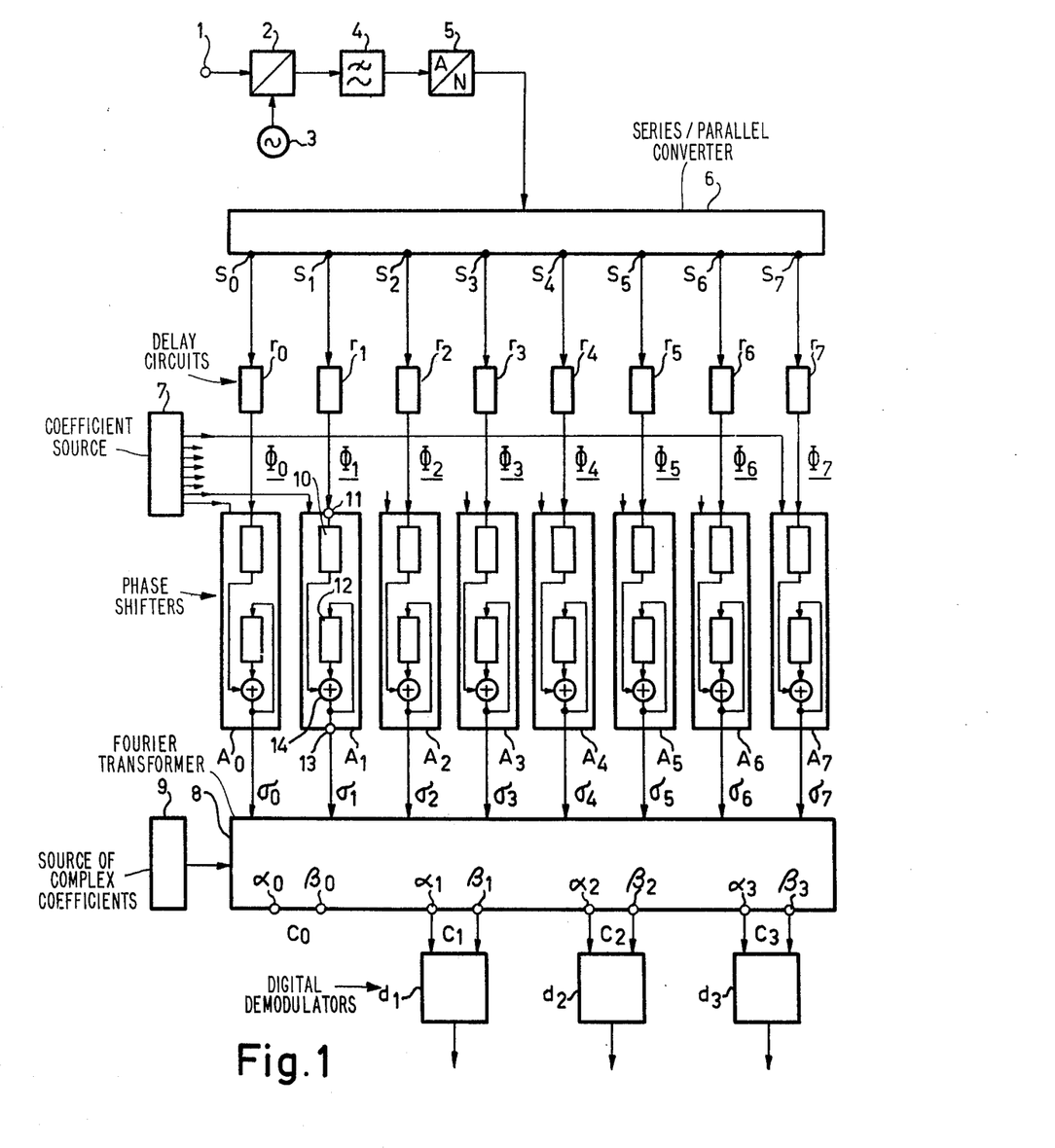
FIG. 1 shows a demultiplexer according to the invention.

FIG. 1 shows the demultiplexer according to the invention in which a frequency multiplex signal is converted into its base band signals. The arrangement shown receives at its input 1 the multiplex signal in an analog shape. The latter is formed by a given number of channel signals each having a bandwidth $\Delta f$. For a speech signal $\Delta f$ is approximately 4000 Hz. The multiplex signal is applied to a modulator 2 receiving from the generator 3 a carrier signal of suitable frequency so as to generate a frequency-transposed multiplex signal whose lowest frequency corresponds to an odd multiple of the frequency $\Delta f/2$. The lowpass filter 4 removes the signals which are produced around the multiples different from zero of the carrier frequency.

Figure 2:
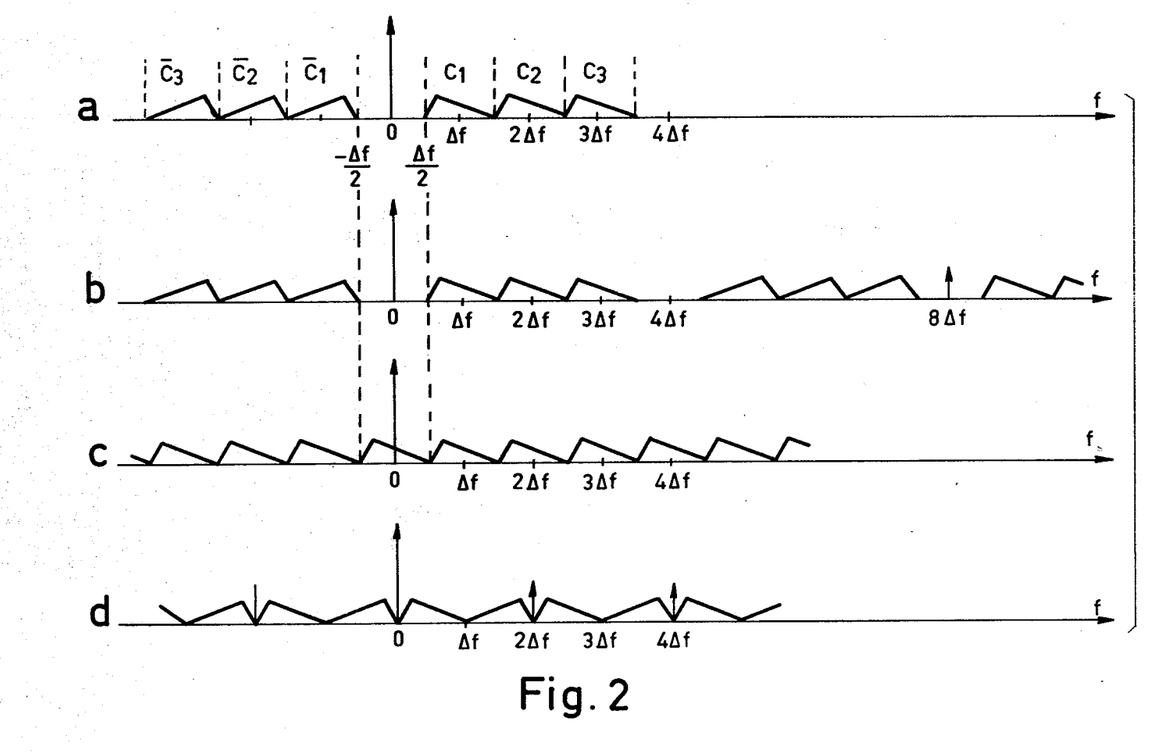
FIGS. 2 and 3 show signal spectra and signal samples in the arrangement of FIG. 1.

To simplify the description of the system the general case will be considered hereinafter in which the multiplex signal is constituted by three channel signals having a bandwidth $\Delta f$ and in which the lowest frequency of the transposed signal is equal to $\Delta f/2$. FIG. 2a shows in that case the spectrum of the signal at the output of the filter 4. Starting from the known complex signal, this spectrum on the side of the positive frequencies between $\Delta f/2$ and $(7/2)\Delta f$ comprises the spectra of the complex signals $C_1$, $C_2$, $C_3$ which correspond to the channels Nos. 1, 2, 3 and on the side of the negative frequencies between $-\Delta f/2$ and $-(7/2)\Delta f$ comprises the added complex signal spectra $\overline{C}_1$, $\overline{C}_2$ and $\overline{C}_3$. In the frequency band of $-\Delta f/2$ to $\Delta f/2$ an unused channel number 0 is situated for which it can be assumed that this channel comprises the complex signals Co and $\overline{Co}$ which are equal to zero.

The transposed multiplex signal is subsequently applied to a digital-to-analog converter 5 to be sampled therein with a frequency of $8 \Delta f$ and coded. The spectrum of the sampled signal at the output of the converter 5 is shown in FIG. 2b.

The digital signal at the output of the converter 5 is applied to the series-parallel converter 6 having 8 outputs $S_0$, $S_1$ ... $S_7$. The codewords appear with a frequency $\Delta f$ at each output $S_i$ while the code words of two successive outputs $s_i$ and $S_{i+1}$ occur a time interval $\frac{1}{8} \cdot (1/\Delta f)$ after each other.

Figure 3:
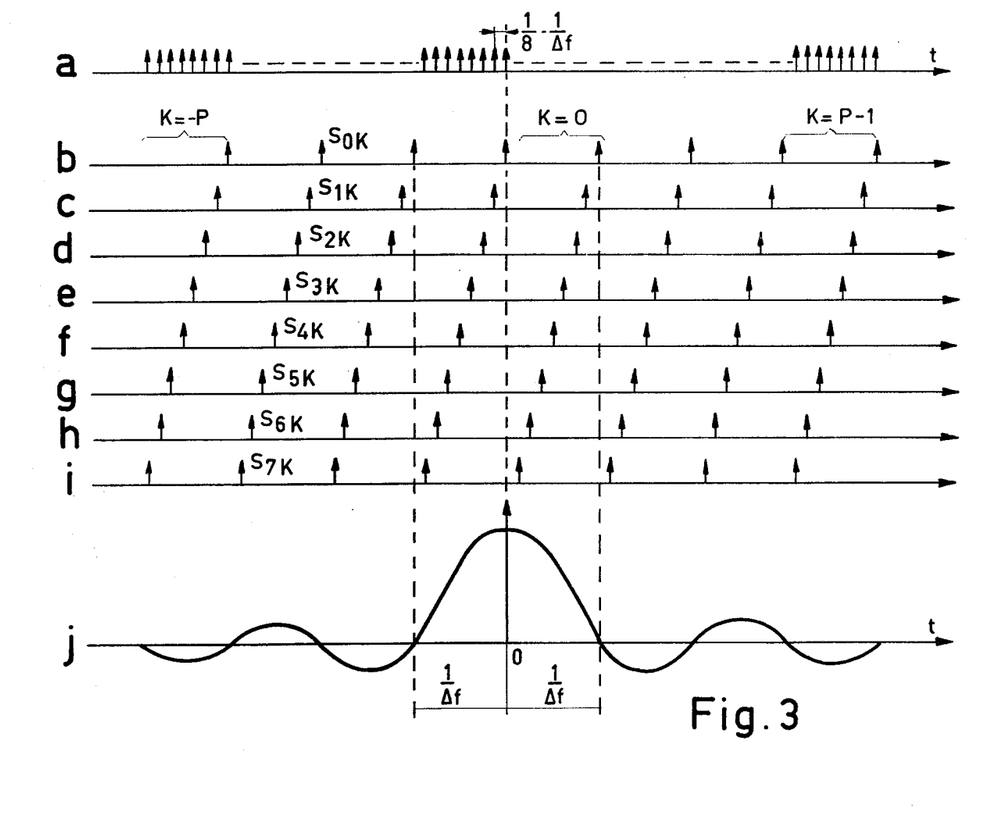

FIG. 3 diagrammatically shows the instants when the code words appear at the input and the outputs of the series parallel converter 6.

The diagram 3a shows the series of code words at the input of the converter 6 occurring a time interval $\frac{1}{8} \cdot (1/\Delta f)$ after each other. The eight diagrams 3b, 3c ... 3i shows the eight series of code words $S_{0k}$, $S_{1k}$ ... $S_{7k}$ at the outputs of the converter 6. The index $k$ serves to indicate the serial number of a code word in the series. The successive code word in each series occur with a period $1/\Delta f$ and the code words of the series $S_{1k}$, $S_{2k}$ ... $S_{7k}$ are delayed over a period $\frac{1}{8} \cdot (1/\Delta f)$, $(2/8) \cdot (1/\Delta f)$ ... $\frac{7}{8} \cdot (1/\Delta f)$ relative to the code words in the series $S_{0k}$ to be considered hereinafter as a reference series.

The outputs $S_0, S_1, \ldots S_7$ of the converter 6 are connected to delay circuits $r_0, r_1, \ldots r_7$ causing suitable delays so that the code words occurring within a cycle of the converter 6 at the outputs $S_0, \ldots S_7$ simultaneously occur at the outputs of these delay circuits. It follows from the diagrams 3b, 3c, ... 3i that this result is obtained with the circuits $r_0, r_1 \ldots r_7$ if these delay circuits introduce the delay times $1/\Delta f$, $\frac{7}{8} \cdot (1/\Delta f) \ldots \frac{1}{8} \cdot (1/\Delta f)$. The circuit $r_0$ introducing a delay which is equal to a period with which the code words occur at the output $S_0$ will be denoted as reference delay circuit.

Connected to the outputs of these 8 delay circuits are the 8 calculating members $A_0, A_1 \ldots A_7$ to which coefficients are applied which are derived from a source 7. In the arrangement as described in said French Pat. specification No. 72 21 646 each calculating member is constituted by a non-recursive digital filter which generates with the frequency $\Delta f$ code words each being the weighted sum of a given number of incoming code words while the weighting factors for a certain calculating member are equal to the filter coefficients characterizing a lowpass filter having a cut-off frequency of $\Delta f/2$.

To render the coefficients used in each calculating member more precise, the diagram 3j of FIG. 3 shows the pulse response of such a lowpass filter which is symmetrical relative to the reference time $t = 0$ where it reaches its maximum value and which is zero at the instants which are multiples of $1/\Delta f$. The weighting factors used in the calculating member $A_0, A_1 \ldots A_7$ utilized for multiplication by 2P incoming code words $S_{0k}, S_{1k} \ldots S_{7k}$ ($k$ varies between $-P$ and $P-1$) are the values $a_{0k}, a_{1k} \ldots a_{7k}$ of the pulse response at the instants when these incoming code words appear at the output of the series parallel converter 6, i.e. at the instants when the arrows in the diagrams 3b, 3c ... 3i are shown.

The code words $\sigma_0, \sigma_1 \ldots, \sigma_7$ at the outputs of the calculating members are thus in conformity with what has been described in said French Pat. specification No. 72 21 646:

$$\begin{cases} \sigma_0 = \sum_{k=-P}^{P-1} S_{0k} \cdot a_{0k} \\ \sigma_1 = \sum_{k=-P}^{P-1} S_{1k} \cdot a_{1k} \\ \vdots \qquad \vdots \\ \sigma_7 = \sum_{k=-P}^{P-1} S_{7k} \cdot a_{7k} \end{cases} \quad (1)$$

These code words $\sigma_0, \sigma_1 \ldots \sigma_7$ occur at the frequency $\Delta f$ and due to the delays caused by the circuits $r_0, r_1 \ldots r_7$ they appear simultaneously.

The code words $\sigma_0, \sigma_1 \ldots \sigma_7$ are applied to the inputs of the discrete Fourier transformer 8 in which as described in said patent application they are added after they have been multiplied by complex coefficients which are supplied by the source 9 and correspond to carrier signals whose frequency is an even multiple of $\Delta f/2$.

In the example chose the following calculations are performed:

$$\begin{cases} C_0 = \sum_{i=0}^{7} \sigma_i \\ C_1 = \sum_{i=0}^{7} \sigma_i \cdot e^{-j\frac{\pi}{4}i} \\ C_2 = \sum_{i=0}^{7} \sigma_i \cdot e^{-j\frac{\pi}{2}i} \\ C_3 = \sum_{i=0}^{7} \sigma_i \cdot e^{-j3\frac{\pi}{4}i} \end{cases} \quad (2)$$

Digital signals with the sampling frequency $\Delta f$ occur at the outputs $(\alpha_1, \beta_1)$, $(\alpha_2, \beta_2)$, $(\alpha_3, \beta_3)$ of the transformer 8. These signals represent the real and imaginary parts of the complex signals $C_1$, $C_2$, $C_3$ which occur in the channels having the channel numbers 1, 2 and 3 of the multiplex signal.

The zero components of the complex signal Co are obtained at the terminals ($\alpha_0, \beta_0$).

The spectra of the complex signals $C_1$, $C_2$, $C_3$ which are sampled with the frequency $\Delta f$ and correspond to the output digital signals of the discrete Fourier transformer 8 have the same shape as those shown in diagram 2c.

The digital demodulators $d_1, d_2, d_3$ connected to the outputs $(\alpha_1, \beta_1)$, $(\alpha_2, \beta_2)$, $(\alpha_3, \beta_3)$ and whose construction and operation are described in said U.S. Pat. No.

3,891,803 convert the complex signals $C_1$, $C_2$, $C_3$ into the real base band signals corresponding to the channels 1, 2 and 3 which signals are sampled with a frequency of $2 \Delta f$. The spectra of these base band signals have the same shape as those shown in the diagram 2d.

The object of the present invention is to provide another embodiment of the calculating members $A_o$, $A_1$ ... $A_7$ which is generally more economical. Before describing the construction of these novel calculating members it is advantageous to describe the role of these calculating members in the arrangement of FIG. 1.

The different cascade circuits each being constituted by a delay circuit and a calculating member $r_o$ and $A_o$ are $r_1$ and $A_1$, ... $r_7$ and $A_7$ and may be considered as digital phase shifters $\phi_o$, $\phi_1$ ... $\phi_7$ with the step-shaped phase frequency-characteristics shown for the different phase shifting networks in FIG. 4. The characteristic of the phase shifter $\phi_o$ denoted by $\phi_o$ is a special case for which the height of the step is equal to zero; the phase variations are zero irrespective of the frequency. The characteristic of the phase shifter $\phi_1$ corresponds to the step-shaped curve denoted by $\phi_1$. In the band $[-(\Delta f/2), \Delta f/2]$ the phase shift is zero; for successive frequency bands with a bandwidth of $\Delta f$ the negative phase shifts increase by $-7\pi/4$. The other characteristics $\phi_2$, $\phi_3$ ... $\phi_7$ corresponding to the circuits $(r_2, A_2)$, $(r_3, A_3)$ ... $(r_7, A_7)$ each have a stepshaped phase characteristic with a phase shifter zero in the band $[-(\Delta f/2), \Delta f/2]$ and increasing phase shifts for successive frequency bands which bands again have a width of $\Delta f$. For the characteristics $\phi_2$, $\phi_3$ ... $\phi_7$ this increase of the phase shifts is $-(6\pi/4)$, $-(5\pi/4)$, ... $-(\pi 4)$, respectively. The steps of these curves are shown by broken lines with the exception of that of curve $\phi_7$ shown by a solid line.

Figure 4:
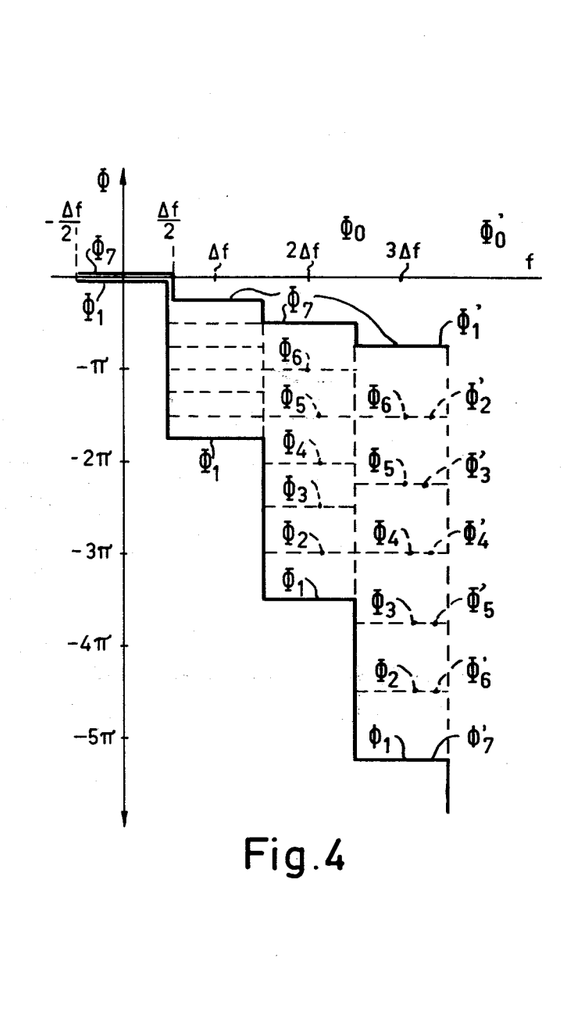
FIG. 4 shows the step-shaped phase-frequency characteristic of the phase shifters.

It will now be described how the characteristics $\phi_o$, $\phi_1$, ... $\phi_7$ of FIG. 4 are derived from the phase-frequency characteristics of the delay circuits $r_o$, $r_1$ ... $r_7$ and of the calculating members $A_o$, $A_1$, ... $A_7$.

Figure 5:
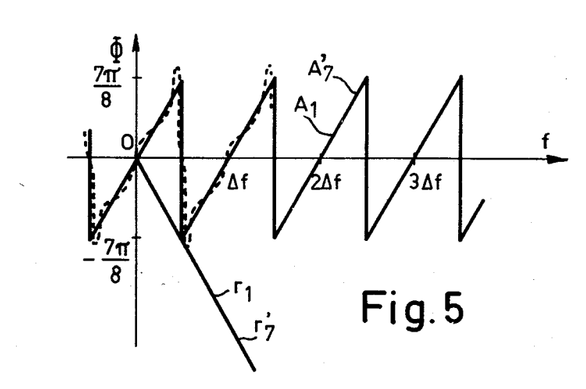
FIGS. 5 and 6 show the sawtooth-shaped phase-frequency characteristics of two phase shifters and of two delay circuits.
Figure 6:
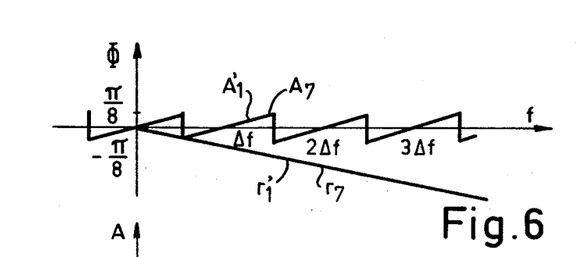

The delay circuits $r_o$, $r_1$ ... $r_7$ delay the output code words occurring at the outputs $S_o$, $S_1$ ... $S_7$ of the series parallel converter 6 over $1/\Delta f$, $7/8$ $\Delta f$, ... $1/8$ $\Delta f$, respectively. Since these output code words occur at each of the outputs $S_o$, $S_1$, ... $S_7$ with a period $1/\Delta f$, each of these delay circuits has a phase-frequency characteristic which constituted by a straight line through the original one while the slope of this straight line for the circuits $r_o$, ... $r_7$ is equal to 0, $-7/8 \cdot (2\pi\Delta f)$, ... $-1/8 \cdot (2\pi/\Delta f)$. In FIGS. 5 and 6 the straight lines denoted by $r_1$ and $r_7$ show the phase-frequency characteristics of the delay circuits $r_1$ and $r_7$.

As already noted the calculating members $A_o$, $A_1$ ... $A_7$ supply the code words $\tau_o$, $\tau_1$, ... $\tau_7$ according to the expression (1). In these expressions $S_{ok}$, $S_{1k}$, ... $S_{7k}$ are the code words delayed by the delay circuits $r_o$, $r_1$, ... $r_7$ which occur simultaneously at the outputs of the circuits $r_o$, ... $r_7$ namely at the reference instant which is formed by the instant when the numbers $S_{ok}$ (see diagram 3b) occur. The filter coefficients $a_{ok}$, $a_{1k}$, ... $a_{7k}$ characterize a low pass filter having a cut-off frequency of $\Delta f/2$ whose pulse response is shown in FIG. 3j. These coefficients have values given by the pulse response namely by sampling of this pulse response with series of sampling pulses undergoing a time shift $1/\Delta f$, $7/8 \cdot (1/\Delta f)$ ... $1/8 \cdot (1/\Delta f)$ relative to said reference instants.

Figure 7:
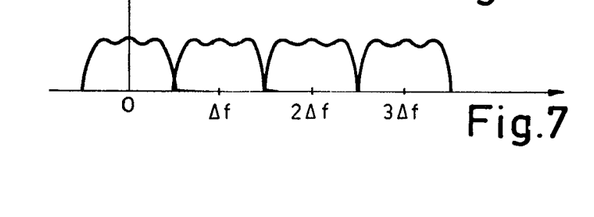
FIG. 7 shows the amplitude-frequency characteristic of the phase shifters and FIG. 9 shows how this characteristic is obtained in a recursive embodiment of these phase shifters.

All calculating members have the same amplitude-frequency characteristic which is shown in FIG. 7. This characteristic is that of a lowpass filter having a cut-off frequency of $\Delta f/2$ which is periodically repeated around all integral multiples of the sampling frequency $\Delta f$. This characteristic has certain distortions in the passband when calculating members of the non-recursive type are used.

When the pulse response is chosen to be symmetrical, the phase-frequency characteristic for each calculating member is accurately linear with a slope dependent on the serial number of the calculating member. This phase-frequency characteristic is likewise periodical and has the same periodicity as the amplitude-frequency characteristic of FIG. 7. The slope of the phase-frequency characteristic for each of the calculating members corresponds to the above given values of the used coefficients in each calculating member. For the calculating members $A_o$, $A_1$ ... $A_7$ this slope is 0, $7/8 \cdot (2\pi/\Delta f)$ ... $1/8 \cdot (2\pi/\Delta f)$. In FIGS. 5 and 6 the sawtooth-shaped curves denoted by $A_1$ and $A_7$ show the phase-frequency characteristic of the calculating members $A_1$ and $A_7$. The calculating members are hereinafter referred to as sawtooth-shaped phase shifters.

By adding in FIG. 5 the ordinates of the curves $r_1$ and $A_1$, the step-shaped curve $\phi_1$ of FIG. 4 is obtained. By adding the ordinates of the curve $r_1$ and $A_7$ of FIG. 6, the curve $\phi_7$ of FIG. 4 is obtained. The other intermediate curves of FIG. 4 may be obtained in the same manner. It may be shown in a simple manner that the cascade circuit of the delay circuit $r_o$ and of the calculating member $A_o$ does not cause any phase shift.

Starting from the step-shaped characteristics of the phase shifters $\phi_o$, $\phi_1$ ... $\phi_7$ the operation of the described arrangement is as follows. As already noted the multiplex signal to be converted is constituted by complex signals $C_1$, $C_2$, $C_3$ and their added complex signals $\overline{C}_1$, $\overline{C}_2$, $\overline{C}_3$ which after sampling with the Nyquist frequency $8f$ each occupy in the manner shown in FIG. 2b a frequency band having a width of $\Delta f$. However, since a sampling frequency at the outputs $S_o$, $S_1$ ... $S_7$ of the series parallel converter 6 is reduced to $\Delta f$, the complex signals $C_1$, $C_2$, $C_3$, $\overline{C}_1$, $\overline{C}_2$, $\overline{C}_3$ jointly occur in each of the frequency bands having a width of $\Delta f$ occurring around the integral multiples of the sampling frequency $\Delta f$. In these bands these complex signals have their original amplitude-frequency characteristic, but they have undergone phase shifts which are dependent on the considered output of the converter 6.

Figure 8:
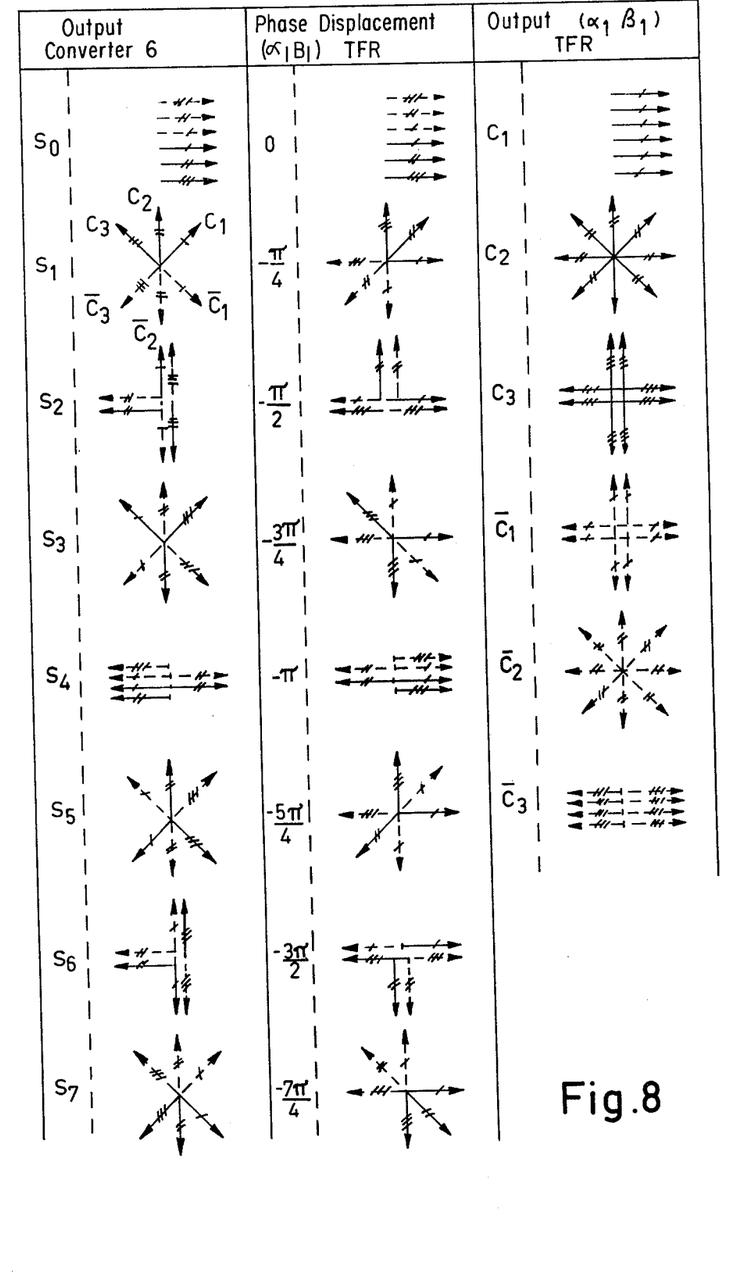
FIG. 8 shows vector diagrams for illustrating the phase shifts of the signals.

The first column of the table of FIG. 8 shows for each of the outputs $S_o$, $S_1$, ... $S_7$ of the converter 6 the phase of each of the complex signals $C_1$, $C_2$, $C_3$, $\overline{C}_1$, $\overline{C}_2$, $\overline{C}_3$ for the frequency band $[-(\Delta f/2), \Delta f/2]$. The complex signals $\overline{C}_1$, $\overline{C}_2$, $\overline{C}_3$ are denoted by vectors with a solid line and provided with a transversal line, two transversal lines and three transversal lines; the complex signals $C_1$, $C_2$, $C_3$ are denoted by broken line vectors and again with a transversal line, two transversal lines and three transversal lines. All vectors at the output $S_o$ have the same phase which is considered as a reference phase. The vector $C_1$ is obtained at the output $S_1$, $S_2$ ... $S_7$ by a reference phase by a phase shift of $\pi/4$, $2\pi/4$, ... $7\pi/4$ relevant to the reference phase, the vector $C_2$ is obtained by a phase shift of $\pi/2$, $2\pi/2$, ... $7\pi/2$ relevant to the reference phase; the vector $C_3$ is obtained by phase shifts of $3\pi/4$, $2 \cdot (3\pi/4)$, ... $7 \cdot (3\pi/4)$ relevant to the reference phase, In the considered frequency band $[-(\Delta f/2) -(\Delta F/2)]$ the added complex vectors $\overline{C}_1$, $\overline{C}_2$, $\overline{C}_3$ have phase shifts of equal value but with opposite sign relative to the phase shifts of the vectors $C_1$, $C_2$, $C_3$.

In accordance with FIG. 4 the phase shifters $\phi_0$, $\phi_1$ ... $\phi_7$ do not cause a phase shift of the signals in the frequency band $[-(\Delta f/2), \Delta f/2]$ so that the first column of the table of FIG. 8 indicates the phases of the vectors $C_1$, $C_2$, $C_3$, $\overline{C}_1$, $\overline{C}_2$, $\overline{C}_3$ at the inputs of the discrete Fourier transformer 8 to which the code words $\sigma_0, \sigma_1 ... \sigma_7$ are applied. The formulas (2) show that in this Fourier transformer the signals $C_1$, $C_2$, $C_3$ are obtained by adding the input code words $\sigma_i$ (i varies between 0 and 7) after multiplication by the powers $$e^{-j\frac{\pi}{4}i}, e^{-j\frac{\pi}{2}i}, e^{-j\frac{3\pi}{4}i}.$$

These multiplications by the complex e powers correspond for the complex signals to a phase shift of $-(\pi/4)i, -(\pi/2)i, -(3\pi/4)i$. The second column of the table of FIG. 8 shows the phase shifts obtained by the Fourier transformer $-(\pi/4)i$ in order to obtain the signal $C_1$ at the outputs $(\alpha_1, \beta_1)$ and the position of the vectors $C_1$, $C_2$, $C_3$, $\overline{C}_1$, $\overline{C}_2$, $\overline{C}_3$ after these phase shifts.

The third column of the table of FIG. 8 shows for each of the vectors the result of the addition taking place in the Fourier transformer so as to obtain a signal at the outputs $(\alpha_1, \beta_1)$. This table shows that the sum of all vectors is zero except the sum corresponding to the vector $C_1$. Thus only the complex signal $C_1$ located in the frequency band of $[-(\Delta f/2), \Delta f/2]$ is obtained at the output $(\alpha_1, \beta_1)$ of the discrete Fourier transformer.

In the same way it can be shown that only the signals $C_2$ and $C_3$ located in the frequency band of $[-\Delta f/2, \Delta f/2]$ are obtained at the outputs $(\alpha_2, \beta_2)$ and at the outputs $(\alpha_3, \beta_3)$ of the discrete Fourier transformer. In addition to the signals $C_1$, $C_2$, and $C_3$ located in the frequency band $[-(\Delta f/2), \Delta f/2]$ these signals also occur at the relevant outputs $(\alpha_i, \beta_i)$ in frequency bands having a width of $\Delta f$ located around integral multiples of the sampling frequency $\Delta f$. To show this the same procedure may be followed as described above. To this end the phase of the vectors $C_1$, $C_2$, $C_3$, $\overline{C}_1$, $\overline{C}_2$, $\overline{C}_3$ at the outputs of the series parallel converter 6 is determined in the considered frequency band and subsequently the phase shifts determined by the characteristics of the phase shifters $\phi_0$ to $\phi_7$ are introduced on these vectors. The phase shifts introduced by the Fourier transformer are then processed and finally the sums are formed which are given in the expressions (2).

The invention relates to the construction of the calculating members or phase shifters having a sawtooth-shaped characteristic, $A_0$, $A_1$ ... $A_7$. The phase shifters mentioned in said U.S. Pat. No. 3,891,803 are formed as non-recursive lowpass filters whose frequency characteristic for each phase shifter was accurately linear and in which the slope of the phase-frequency characteristic was given by the serial number of the output on the series parallel converter. The Applicant has found that for a satisfactory operation of the arrangement according to the invention it is sufficient if the said sawtooth-shaped phase-frequency characteristic denotes the difference between the phase-frequency characteristics of the calculating members $A_1$, $A_2$ ... $A_7$ and the phase-frequency characteristic of the reference phase shifter $A_0$. It is to be noted that for a satisfactory crosstalk attenuation it is required that the attenuation slope of the amplitude-frequency characteristic of the sawtooth-shaped phase shifters (see FIG. 7) at the limit of the passband is large. With non-recursive phase shifters this high slope requires a large number of coefficients so that the manufacture of these phase shifters is expensive as regards the required number of multipliers and storage elements.

According to the invention the sawtooth-shaped phase shifters $A_0$, $A_1$, ... $A_7$ are of the recursive type. These phase shifters are built likewise as recursive filters with special coefficients. For manufacturing the recursive filters the book by Gold and Radar "Digital Processing of Signals" McGraw Hill Book company, 1969 may be consulted. In the form shown diagrammatically in FIG. 1 a phase shifter of the recursive type, for example, $A_1$ includes a first nonrecursive section 10 in which the weighted sum with coefficients is determined. The output code words of the register $r_1$ received through the input 11 are applied to a delay line not shown. Also in the recursive section 12 of the phase shifter $A_1$ a weighted sum is determined with coefficients which are supplied by the store 7. The output code words occurring at the output 13 are taken up in a delay line (not shown). The code words occurring at the outputs of the nonrecursive section 10 and the recursive section 12 are added together in the adder 14 whose output is connected to the output 13.

The phase shifters $A_0$, $A_1$ ... $A_7$ are each constituted by an all-pass filter in which the phase-frequency characteristic is given by a curve repeating periodically with a frequency $\Delta f$ which is approximately a straight line and intersects the frequency axis in case of integral multiples of the frequency $\Delta f$ which intersection corresponds to a phase shift of zero and in which for each of the phase shifters the slopes of the curves are equal to the slopes of the above-mentioned phase shifters. Since the said phase shifters have a recursive section 12 it is impossible to realize accurately a linear phase characteristic as in the case of non-recursive phase shifters. As a result the sawtooth-shaped phase-frequency characteristics are only realized with a certain approximation. The broken line curve of FIG. 5 shows the shape of this phase-frequency characteristic approximated for the phase shifter $A_1$. The phase shifters manufactured in this manner thus cause phase distortions but no amplitude distortions.

These phase shifters may be defined by their Z transformations which, for example, for a phase shifter of the $m$ order is:

$$H(Z) = \frac{L_0 + L_1 \cdot Z^{-1} + ... + L_{m-1} \cdot Z^{-(m-1)} + L_m \cdot Z^{-m}}{L_m + L_{m-1} \cdot Z^{-1} + ... + L_1 \cdot Z^{-(m-1)} + L_0 \cdot Z^{-m}} \quad (3)$$

In this formula (3) the references $L_0, L_1 ... L_{m-1}, L_m$ represent the coefficients supplied by the store 7. $Z^{-1}$ corresponds to the delay of each element of the delay lines of the sections 10 and 12. The denominator defines the operations to be performed in the non-recursive section 10. The numerator defines the operations to be performed in the recursive section 12. When the numerator and denominator polynome have the same coefficients, the reference $H(z)$ represents the amplitude-frequency characteristic of an all-pass filter. In each phase shifter $A_0$, $A_1$, ... $A_7$ a number of coefficients are used which determine the slope of the sawtooth-shaped characteristic.

The phase shifters may be formed in such a manner that the phase-frequency characteristic of each of these phase shifters has a certain sawtooth-shaped variation. On the other hand these phase shifters may be formed in such a manner that the difference between the phase-frequency characteristic of a phase shifter and the characteristic of a reference phase shifter has the required sawtooth-shaped variation. As will be described hereinafter a considerable reduction in the cost of phase shifters is obtained.

In the latter case the coefficients which determine the slope of the sawtooth-shaped curve in each of the phase shifters are applied to the non-recursive section 10 while the recursive sections 12 of all these phase shifters are formed in exactly the same manner and in addition the same coefficients are used for each of the recursive sections.

Figure 9:
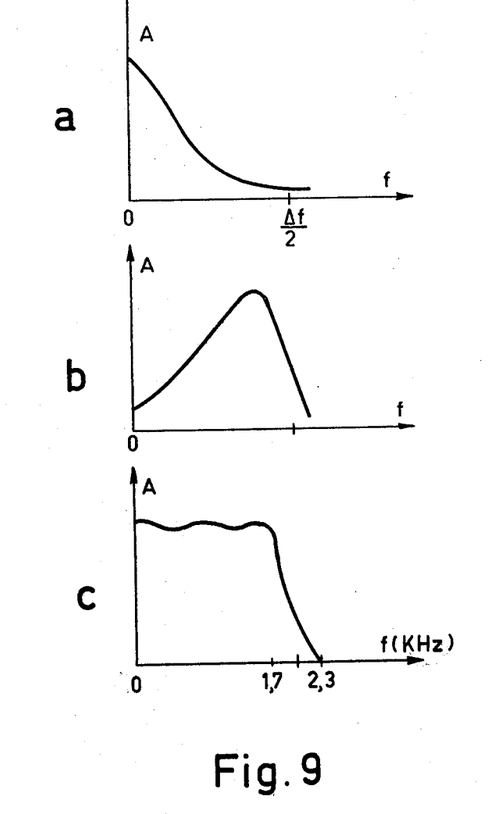

It has thus been achieved that the non-recursive section 10 of each of the phase shifters $A_i$ has the desired sawtooth-shaped phase-frequency characteristic while it is possible with a relatively low number of coefficients to realize an amplitude-frequency characteristic with each of the non-recursive sections which corresponds to that of a simple low-pass filter, that is to say, a lowpass filter having a fairly weak attenuation slope, for example, of the type as is shown in FIG. 9a in the frequency band of $0-\Delta f$. For a sampling frequency $\Delta f$ this characteristic of FIG. 9a is repeated around all multiples of $\Delta f$.

The coefficients of each recursive section 12 of the phase shifters are chosen in known manner such that the amplitude-frequency characteristic of each of these recursive sections has the variation shown in FIG. 9b so that the amplitude-frequency characteristic of each of the phase shifters has the variation shown in FIG. 9c and thus has a substantially flat shape in the part of the band where the channel signal is present and with a relatively high attenuation slope which is required at the limit of the pass band.

The phase-frequency characteristic of each of the recursive sections 12 may be completely arbitrary so that this phase-frequency characteristic does not impose certain requirements on the coefficients. In fact, since this phase-frequency characteristic is the same for all phase shifters they do not influence the phase frequency characteristic of the difference between the phase frequency characteristics of the phase shifters and the reference phase-frequency characteristic of the reference phase shifter. The phase-frequency characteristics corresponding to this difference each have the sawtooth-shaped variation which is determined by the non-recursive sections. With the phase shifters formed in this manner the advantage is obtained that the required attenuation slope of the amplitude-frequency characteristic can be obtained with a relatively low number of coefficients so that only a small number of multipliers and coefficient stores is necessary.

When more particularly for a speech signal the amplitude-frequency characteristic shown in FIG. 9c is to be realized which characteristic is substantially flat up to 1700 Hz and has an attenuation of approximately 80 dB at approximately 2300 Hz, this characteristic can be realized for each of the phase shifters with the aid of 20 coefficients if these phase shifters are formed in a non-recursive embodiment, for example, in the manner as described in said U.S. Pat. No. 3,891,803, while for the abovementioned embodiment according to the invention it is sufficient if 8 coefficients are used in the non-recursive section 10, and 8 coefficients are used in the non-recursive section 12. As a result an economy in the number of multipliers and especially the number of coefficient stores is obtained which economy is the greater as the number of phase shifters is larger. All this is further shown in the table below. This table makes it possible to compare the number of multipliers and coefficient stores in the non-recursive and recursive embodiments of the phase shifters for an arrangement using 64 phase shifters and suitable for demultiplexing a multiplex signal formed by 30 channel signals.

|  |  | Non-recursive | Recursive |
|---|---|---|---|
| 1 phase shifter | Multipliers | 20 | 8 + 8 = 16 |
|  | Coefficient stores | 20 | 8 + 8 = 16 |
|  | delay circuits | 20 | 8 |
| 64 phase shifters | Multipliers | 20 × 64 = 1280 | 16 × 64 = 1040 |
|  | Coefficient stores | 20 × 64 = 1280 | (8 × 64) +8 = 520 |
|  | delay circuits | 20 × 64 = 1280 | 8 × 64 = 512 |

Since in both the non-recursive and the recursive section of the phase shifters the same number of coefficients can be used, for example, 8 in the above-mentioned embodiment it is particularly advantageous. In fact each of the phase shifters can be built up in canonic form so that only one delay line is necessary. In addition to the said economy a considerable economy in delay circuits is obtained, for example, the number of delay circuits decreases from 20 to 8 per phase shifter. The table above shows the number of delay circuits which is necessary for 1 and for 64 phase shifters.

The demultiplexer of FIG. 1 and particularly the sawtooth-shaped phase shifters according to the invention have been described for the case where the multiplex signal is constituted by three channel signals. Extension of the arrangement to an arbitrary number of channels is possible.

The invention may be alternatively used for converting base band signals into a frequency division multiplex signal. The previously mentioned French patent application describes that for this multiplexer some operations are to be performed which are reciprocal to those which are to be performed in the demultiplexer, while circuits are used all of which are substantially identical. Particularly the same calculating members or phase shifters having a sawtooth-shaped characteristic are used which according to the invention are of the recursive type.

Figure 10:
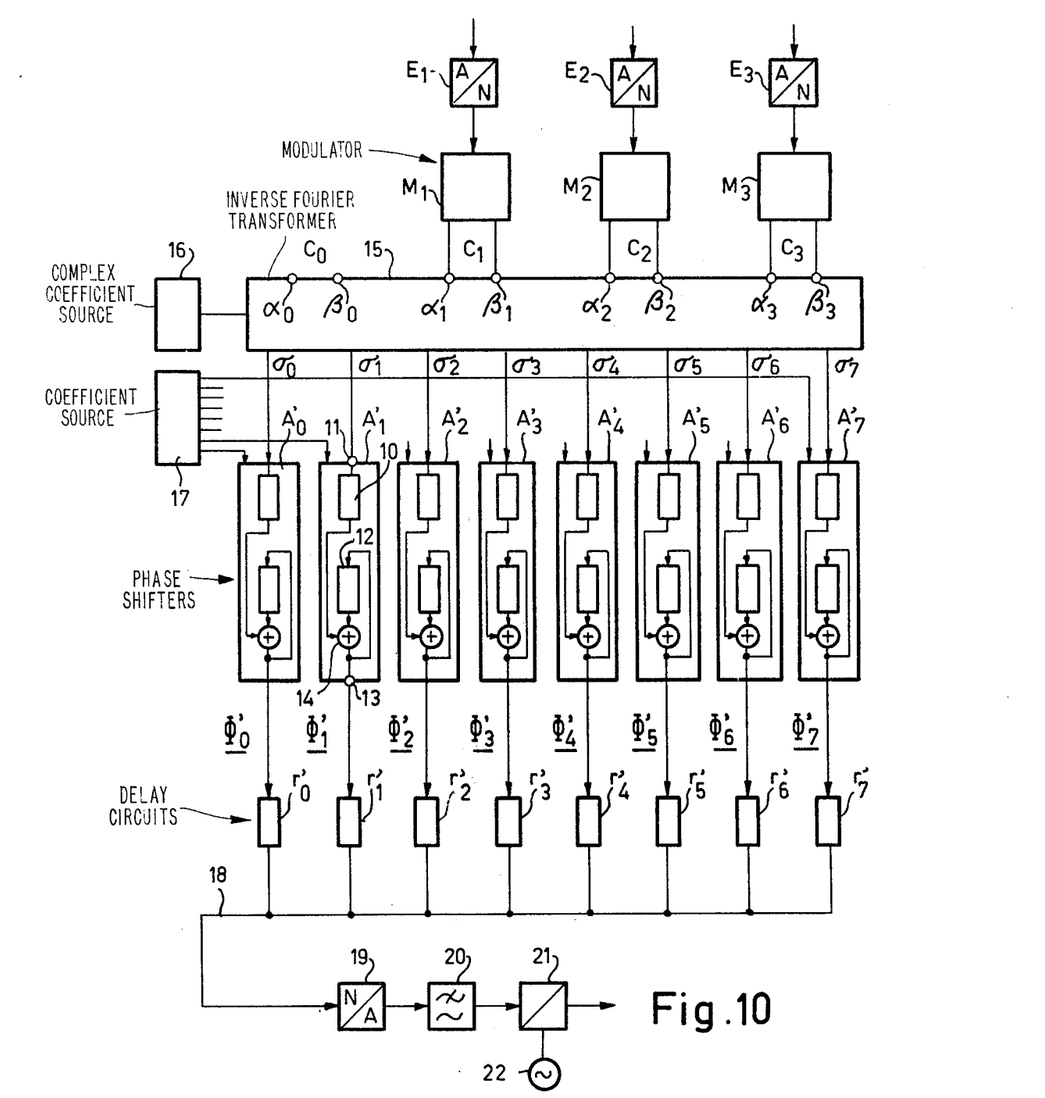
FIG. 10 shows a frequency multiplexer according to the invention.

FIG. 10 shows the structure of the multiplexer according to the invention in the case where the number of channel signals is equal to three.

The three base band signals each having a frequency band of $\Delta f$ are applied to the analog-to-digital converters $E_1$, $E_2$, $E_3$ in which these signals are sampled and coded with the frequency $2\Delta f$. The spectrum of each of these sampled signals has the shape shown in FIG. 2d. The digital signals which can be applied from this converter to modulators $M_1$, $M_2$, $M_3$ are formed in the manner as described in prior French Patent application No. 72 21 646. These modulators supply digital signals sampled with a frequency of $\Delta f$ and corresponding to the real and imaginary parts of the complex signals $C_1$, $C_2$, $C_3$. These complex signals $C_1$, $C_2$, $C_3$ jointly constitute with the added complex signals $C_1$, $C_2$, $C_3$ the real time signals which are applied to the converters $E_1$, $E_2$, $E_3$. The spectrum of the complex signals $C_1$, $C_2$, $C_3$ at the output of the modulators $M_1$, $M_2$, $M_3$ has the shape shown in FIG. 2c.

The outputs of the modulators $M_1$, $M_2$, $M_3$ are connected to the inputs $(\alpha_1, \beta_1)$, $(\alpha_2, \beta_2)$, $(\alpha_3, \beta_3)$ of the inverse Fourier transformer 15. With the inputs $(\alpha_o, \beta_o)$ at which it is assumed that the zero components of a complex signal $C_o$ are applied the transformer 15 has four pairs of inputs and it supplies the eight digital signals $\sigma_o, \sigma_1 \ldots \sigma_7$ at eight outputs while in each signal the code words appear with a frequency $\Delta f$ and the code words of different signals occur at the same instants (simultaneously).

In the inverse Fourier transformer 15 the code words of the digital signals at the outputs $\sigma_o, \sigma_1 \ldots \sigma_7$ are obtained by taking the real part of the sum of the complex input signals while these input signals are multiplied by complex coefficients supplied by the coefficient source 16. These output code words are given by the expression:

$$\begin{cases} \sigma_o = Re\left[\sum_{n=0}^{3} C_n\right] \\ \sigma_1 = Re\left[\sum_{n=0}^{3} C_n e^{j\frac{2\pi n}{8}}\right] \\ \vdots \quad \vdots \\ \sigma_i = Re\left[\sum_{n=0}^{3} C_n e^{j\frac{2\pi in}{8}}\right] \\ \vdots \quad \vdots \\ \sigma_7 = Re\left[\sum_{n=0}^{3} C_n e^{j\frac{2\pi 7n}{8}}\right] \end{cases} \quad (4)$$

In these expressions (4) $\sigma_i$ denotes a digital signal which occurs at an arbitrary output $i$ of the transformer 15, where $i$ in the given embodiment assumes all integral values from 0 to 7; $C_n$ indicates the complex signal occurring at an arbitrary input $(\alpha_n, \beta_n)$ of the transformer 15 while in the embodiment shown $n$ assumes all integral values of from 0 to 3.

The digital signals from the transformer 15 are applied to the phase shifyers having a step-shaped phase-frequency characteristics $\phi'_o, \phi'_1, \ldots \phi'_7$. These characteristics, likewise as those of the phase shifters $\phi_o, \phi_1, \ldots \phi_7$ of the demultiplexer occur with a width $\Delta f$ at multiples of the frequency $\Delta f$ but the stepwise increase of phase shifts varies relative to the phase shifters $\phi_i$ of FIG. 1 in the reverse order. As is shown in FIG. 4 the characteristics of the phase shifters $\phi'_o, \phi'_1, \ldots \phi'_7$ are equal to the characteristics of the phase shifters $\phi_o, \phi_7 \ldots \phi_1$ of the demultiplexer. The phase shift increases with an amount equal to $0, -(\pi/4) \ldots -(7\pi/4)$, respectively.

The step-shaped characteristics of the phase shifters $\phi'_o, \phi'_2, \ldots \phi'_7$ are obtained by series arranging phase shifters with a sawtooth characteristic and delay circuits $A'_o$ and $r'_o$, $A'_1$ and $r'_1$, $\ldots A'_7$ and $r'_7$. The sawtooth-shaped characteristics of the phase shifters $A'_o$, $A'_1 \ldots A'_7$ are the same as those of the phase shifters $A_o, A_7 \ldots A_1$ of the demultiplexer. As is shown in FIG. 6 the slopes of the phase shifters $A'_1$ and $A_7$ are equal to $\frac{1}{8} \cdot (2\pi/\Delta f)$ and as is shown in FIG. 5 the slopes of the characteristics of the phase shifters $A'_7$ and $A_1$ are both equal to $\frac{7}{8} \cdot (2\pi/\Delta f)$. According to the invention these phase shifters are also of the recursive type and have the same structure and the same properties as those described above for the phase shifters of the demultiplexer. Their amplitude-frequency characteristic corresponds to that of a lowpass filter having a cut-off frequency of approximately $\Delta f/2$; the phase-frequency characteristics of a phase shifter is such that the difference between this characteristic and that of the reference phase shifter $A'_o$ has a sawtooth-shaped variation while each phase shifter has its own characteristic slope extensively described hereinbefore.

The delay circuits $r'_o, r'_1 \ldots r'_7$ introduce the same delay times as the delay circuits $r_o, r_7 \ldots r_1$ of the demultiplexer, i.e. a delay time of $0, \frac{1}{8} \cdot (1/\Delta f), \ldots \frac{7}{8} \cdot (1/\Delta f)$ and thus have the same phase-frequency characteristics.

The digital signals coming from the delay circuits $r'_o, r'_1 \ldots r'_7$ are combined in the common line 18 where a digital signal is obtained within which the code words occur with a frequency $8\Delta f$. Analogously to the description in said U.S. Pat. No. 3,891,803 it can again be shown that the digital signal occurring at the output lead 18 with a sampling frequency of $8\Delta f$ forms the sampled desired multiplex signal which is, however, transposed in frequency to the zero frequency whose spectrum is shown in FIG. 2b. With the aid of a digital-to-analog converter 19 and a lowpass filter 20 an analog multiplex signal is obtained whose spectrum is shown in FIG. 2a. The modulator 21 receiving from the generator 22 a suitable carrier signal brings the multiplex signal in the desired frequency band.

In a multiplexer which is adapted for converting $N-1$ channel signals into a multiplex signal, the inverse Fourier transformer 15 has $2N$ outputs to which $2N$ phase shifters having a step-shaped phase-frequency characteristic are connected. Each of these phase shifters is constituted by a series arrangement of a phase shifter having a sawtooth-shaped characteristic $A'_i$ and a delay circuit $r'_i$ ($i$ varies between 0 and $2N-1$). The characteristic of a phase shifter $\phi'_i$ is the same as that of a phase shifter $\phi_{2N-i}$ of the demultiplexer while the increase of the phase between successive steps is equal to $-2\pi(1/2N)$. The characteristic of a phase shifter $A'_i$ is the same as that of a phase shifter $A_{2N-i}$ and the slope is equal to $2\pi(i/2N) \cdot {}^{i/}\Delta f)$.

The delay time of a delay circuit $r'_i$ is the same as that of a delay circuit $r_{2n-i}$ and is $(i/2N) \cdot (1/\Delta f)$.

What is claimed is:

1. An arrangement for converting a single side-band frequency division multiplex signal into a corresponding base band channel signals, including a series parallel converter distributing binary coded signal samples (code words) of the multiplex signal equally in time in a cyclical manner over a given number of parallel signal paths while the signal samples in each of these signal paths occur at a frequency which is equal to the bandwidth of a channel signal in which arrangement each of the signal paths incorporates a delay circuit for eliminating the mutual time shifts of the signal samples applied within a cycle to said series parallel converter, a calculating member being provided in series with said delay circuit to which in addition to the output samples of the co-operating delay circuits a given number of filter coefficients is applied which are provided by a source for a given number of filter coefficients, the outputs of said calculating members being coupled to inputs of a discrete Fourier transformer whose outputs are connected to demodulators characterized in that each calculating member is formed as a recursive digital filter to which binary coded signal samples are applied having an input sampling frequency which is equal to the bandwidth of a channel signal and to which also filter coefficients originating from said source are applied, which filter coefficients characterize an amplitude-frequency characteristic of a lowpass filter having a cut-off frequency which corresponds to the half bandwidth of a channel signal and which characterize a phase-frequency characteristic, the phase-frequency characteristic indicating the difference between the phase-frequency characteristic of a calculating member and the phase-frequency characteristic of a calculating member connected to the output of a reference delay circuit, each recursive filter having a sawtooth-shaped characteristic which is constituted by straight lines varying with a given angle of inclination in a parallel manner and intersecting the frequency axis in case of integral multiples of the said input sampling frequency while the slope of said sawtooth characteristic is opposite to the slope of the phase-frequency characteristic of the co-operating delay circuit.

2. An arrangement for converting base band channel signals into a single sideband frequency division multiplex signal comprising an inverse Fourier transformer to which digital signals are applied which are related to the channel signals to be converted and is provided with a given number of signal paths in which linearly coded output samples of the inverse Fourier transformer occur with a frequency which is equal to the bandwidth of a channel signal; a calculating member being incorporated in each signal path to which not only output samples of the inverse Fourier transformer are applied but also filter coefficients which are derived from a source for a given number of filter coefficients, said signal paths incorporating in series with the calculating members delay circuits whose outputs are connected to a common output lead, the time delays of said delay circuits being sugh that the code words in said common output lead occur one after the other while being evenly distributed in time, the digital signal is said common lead corresponding to the multiplex signal, characterized in that each calculating member is formed as a recursive digital filter to which binary coded signal samples are applied having an input sampling frequency which is equal to the bandwidth of a channel signal and to which also filter coefficients originating from said source are applied, which filter coefficients characterize an amplitude-frequency characteristic of a lowpass filter having a cut-off frequency which corresponds to the half bandwidth of a channel signal and which characterize a phase-frequency characteristic, the phase-frequency characteristic indicating the difference between the phase-frequency characteristic of a calculating member and the phase-frequency characteristic of a calculating member connected to the output of a reference delay circuit, said recursive digital filter having a sawtooth-shaped characteristic which is constituted by straight lines varying with a given angle of inclination in a parallel manner and intersecting the frequency axis in case of integral multiples of the said input sampling frequency while the slope of said sawtooth characteristic is opposite to the slope of the phase-frequency characteristic of the co-operating delay circuit.

3. An arrangement as claimed in claim 1, wherein the slope of the straight line corresponding to the difference between the phase-frequency characteristic of an arbitrary calculating member $A_i$ and that of the calculating member connected to the reference delay source is equal to $$2\pi \; \frac{2N-i}{2N} \cdot \frac{1}{\Delta f}$$

where $i$ varies between 0 and $2N-1$ and where $\Delta f$ is the bandwidth of a channel signal and $2N$ is the number of signal paths connected to the series parallel converter.

4. An arrangement as claimed in claim 2, wherein the slope of the straight line corresponding to the difference between the phase-frequency characteristic of an arbitrary calculating member $A'_i$ and that of the calculating member connected to the reference delay circuit is equal to $$2\pi \; \frac{i}{2N} \cdot \frac{1}{\Delta f}$$

where $i$ varies between 0 and $2N-1$ and where $\Delta f$ is the bandwidth of a channel signal and $2N$ is the number of signal paths connected to the IFFT.

5. An arrangement as claimed in claim 1, wherein the recursive digital filters are each built up of a recursive section and a non-recursive section.

6. An arrangement as claimed in claim 5, wherein for all calculating members the recursive sections are equal and that all these recursive sections receive the same filter coefficients which are derived from said source for a given number of filter coefficients.

7. An arrangement as claimed in claim 5, wherein for all calculating members the number of filter coefficients for the non-recursive section is equal to the number of filter coefficients for the recursive section.

8. An arrangement as claimed in claim 2, wherein the recursive digital filters are each built up of a recursive section and a non-recursive section.

9. An arrangement as claimed in claim 8, wherein for all calculating members the recursive sections are equal and that all these recursive sections receive the same filter coefficients which are derived from said source for a given number of filter coefficients.

10. An arrangement as claimed in claim 8, wherein for all calculating members the number of filter coefficients for the non-recursive section is equal to the number of filter coefficients for the recursive section.

* * * * *

UNITED STATES PATENT AND TRADEMARK OFFICE
CERTIFICATE OF CORRECTION

PATENT NO. : 3,971,922
DATED : July 27, 1976
INVENTOR(S) : MAURICE GEORGES BELLANGER and JACQUES LUCIEN DAGUET It is certified that error appears in the above-identified patent and that said Letters Patent are hereby corrected as shown below:

Col. 3, line 11, "(7/2 $\Delta$ f" should be --(7/2) $\Delta$ f--;

Col. 4, lines 42 through 52, equation 2 should read as follows;

$$\begin{cases} C_0 = \sum_{i=0}^{7} \sigma_i \\ C_1 = \sum_{i=0}^{7} \sigma_i \cdot e^{-j\frac{\pi}{4}i} \\ C_2 = \sum_{i=0}^{7} \sigma_i \cdot e^{-j\frac{\pi}{2}i} \\ C_3 = \sum_{i=0}^{7} \sigma_i \cdot e^{-j3\frac{\pi}{4}i} \end{cases} \quad (2)$$

Col. 5, line 33, "-($\pi$ 4)" should be -- -($\pi$/4)--;

line 46, "." should be --is--;

UNITED STATES PATENT AND TRADEMARK OFFICE
CERTIFICATE OF CORRECTION

PATENT NO. : 3,971,922

DATED : July 27, 1976

INVENTOR(S) : MAURICE GEORGES BELLANGER and JACQUES LUCIEN DAGUET

It is certified that error appears in the above-identified patent and that said Letters Patent are hereby corrected as shown below:

Col. 5, line 48, "$-7/8 \: / \: (2\pi \Delta f)$" should be -- $-7/8 \cdot (2\pi/\Delta f)$ --;

Col. 6, line 53, "$\overline{C}_1, \overline{C}_2, \overline{C}_3$" should be -- $C_1, C_2, C_3$ --;

line 55, "$C_1$" should be -- $\overline{C}_1$ --;

line 56, "$C_2, C_3$" should be -- $\overline{C}_2, \overline{C}_3$ --;

line 66, after "phase" "," should be --.--;

Col. 7, line 14, should read as follows: -- $e^{-j\frac{\pi}{4}i}, e^{-j\frac{\pi}{2}i}, e^{-j3\frac{\pi}{4}i}$ . --;

Col. 11, line 6, "$C_1, C_2, C_3$" should be -- $\overline{C}_1, \overline{C}_2, \overline{C}_3$ --;

Col. 12, line 53, "$i/\Delta f$" should be -- $i/\Delta f$ --;

Claim 2, line 17, "sugh" should be --such--;

Signed and Sealed this

Fourteenth Day of December 1976

[SEAL]

Attest:

RUTH C. MASON
*Attesting Officer*

C. MARSHALL DANN
*Commissioner of Patents and Trademarks*